United States Patent
Lukyanov et al.

(10) Patent No.: US 12,237,590 B2
(45) Date of Patent: Feb. 25, 2025

(54) PRINTED CIRCUIT BOARD INTEGRATED ANTENNA FOR TRANSMITTING / RECEIVING DATA

(71) Applicant: SAMSUNG ELECTRONICS CO., LTD., Suwon-si (KR)

(72) Inventors: Anton Sergeevich Lukyanov, Moscow (RU); Mikhail Nikolaevich Makurin, Moscow (RU)

(73) Assignee: Samsung Electronics Co., Ltd., Suwon-si (KR)

( * ) Notice: Subject to any disclaimer, the term of this patent is extended or adjusted under 35 U.S.C. 154(b) by 217 days.

(21) Appl. No.: 18/073,966

(22) Filed: Dec. 2, 2022

(65) Prior Publication Data

US 2023/0178884 A1     Jun. 8, 2023

Related U.S. Application Data

(63) Continuation of application No. PCT/KR2022/019447, filed on Dec. 2, 2022.

(30) Foreign Application Priority Data

Dec. 2, 2021     (RU) ............................ RU2021135450

(51) Int. Cl.
*H01Q 9/04*     (2006.01)
*H01Q 1/22*     (2006.01)
(Continued)

(52) U.S. Cl.
CPC ......... *H01Q 9/0414* (2013.01); *H01Q 1/2283* (2013.01); *H05K 1/0243* (2013.01);
(Continued)

(58) Field of Classification Search
CPC .. H01Q 1/2283; H01Q 9/0414; H05K 1/0243; H05K 1/025; H05K 1/115;
(Continued)

(56) References Cited

U.S. PATENT DOCUMENTS 9,153,863 B2     10/2015 Nair et al.
11,532,894 B2 *  12/2022 Kim .................. H01Q 21/0006
(Continued)

FOREIGN PATENT DOCUMENTS

CN     110676578     1/2020
KR     10-0706615    4/2007
(Continued)

OTHER PUBLICATIONS

Search Report and Written Opinion dated Mar. 9, 2023 issued in International Patent Application No. PCT/KR2022/019447.
(Continued)

*Primary Examiner* — Dameon E Levi
*Assistant Examiner* — Leah Rosenberg
(74) *Attorney, Agent, or Firm* — Nixon & Vanderhye P.C.

(57)     ABSTRACT

The disclosure relates to radio engineering and, for example, to the printed circuit board-integrated antenna of transmitting/receiving data. A printed circuit board-integrated antenna for transmitting/receiving data, the antenna comprises an intermediate section comprising patch elements interconnected by at least one via, wherein a first patch element is disposed in a lower middle layer and is separated by a gap from a conductive solid area, a second patch element is disposed in an upper middle layer and is separated by a gap from the conductive solid area; a parasitic patch element disposed in an upper layer and separated by a gap from the conductive solid area; and a strip line connected directly to an edge of the first patch element, the strip line being disposed in the lower middle layer and configured for communicating a data signal to or from the intermediate section when transmitting/receiving data. The disclosure provides a simplified antenna configuration, for the implementation of which the minimum number of layers is used
(Continued)

in the printed circuit board. The complexity of manufacturing the disclosed antenna is significantly reduced.

17 Claims, 10 Drawing Sheets

(51) Int. Cl.
  *H05K 1/02* (2006.01)
  *H05K 1/11* (2006.01)
(52) U.S. Cl.
  CPC ............ *H05K 1/025* (2013.01); *H05K 1/115* (2013.01); *H05K 2201/0969* (2013.01); *H05K 2201/10098* (2013.01)
(58) Field of Classification Search
  CPC . H05K 2201/0969; H05K 2201/10098; H05K 3/4697; H01R 2201/02; H01L 23/522; H01L 23/5222; H01L 23/5223; H01L 23/5225; H01L 23/5226; H01L 23/60; H01L 23/642; H01L 2223/6677
  See application file for complete search history.

(56) References Cited

U.S. PATENT DOCUMENTS

| | | | |
|---|---|---|---|
| 2007/0080864 A1 | 4/2007 | Channabasappa | |
| 2008/0042915 A1 | 2/2008 | Schillmeier et al. | |
| 2013/0207274 A1* | 8/2013 | Liu | H01L 23/66 257/774 |
| 2015/0381229 A1 | 12/2015 | Tzanidis et al. | |
| 2018/0069286 A1 | 3/2018 | Sugano | |
| 2018/0115036 A1 | 4/2018 | Kushta | |
| 2018/0337456 A1 | 11/2018 | Liu et al. | |
| 2019/0273320 A1* | 9/2019 | Kim | H01Q 21/065 |
| 2019/0393581 A1 | 12/2019 | Moallem | |
| 2020/0091608 A1* | 3/2020 | Alpman | H04B 1/40 |
| 2020/0161766 A1 | 5/2020 | Liu et al. | |
| 2020/0373672 A1 | 11/2020 | Paulotto et al. | |
| 2021/0044011 A1* | 2/2021 | Liu | H01Q 21/065 |
| 2021/0091473 A1 | 3/2021 | Lee et al. | |
| 2021/0167764 A1 | 6/2021 | Makurin et al. | |
| 2021/0175609 A1 | 6/2021 | Ryoo et al. | |
| 2021/0234260 A1 | 7/2021 | Thai et al. | |
| 2021/0249774 A1 | 8/2021 | Hong | |
| 2021/0265723 A1 | 8/2021 | Cho | |
| 2022/0013889 A1* | 1/2022 | Choi | H05K 1/0203 |
| 2023/0028526 A1* | 1/2023 | Kim | H01Q 19/005 |
| 2023/0389173 A1* | 11/2023 | Lin | H05K 1/165 |

FOREIGN PATENT DOCUMENTS

| | | |
|---|---|---|
| KR | 10-2017-0016377 | 2/2017 |
| KR | 10-2019-0123195 A | 10/2019 |
| KR | 10-2020-0011120 | 2/2020 |
| RU | 2449434 | 4/2012 |
| RU | 2680429 | 2/2019 |
| WO | 2017/211378 | 12/2017 |

OTHER PUBLICATIONS

Search Report dated Dec. 2, 2021 issued in Russian Patent Application No. 2021135450/28(074900).

Extended European Search Report dated Sep. 20, 2024 for EP Application No. 22901858.5.

* cited by examiner

PRINTED CIRCUIT BOARD INTEGRATED ANTENNA FOR TRANSMITTING / RECEIVING DATA

CROSS-REFERENCE TO RELATED APPLICATIONS

This application is a PCT-Bypass Continuation Application, claiming priority under § 365(c), of an International application No. PCT/KR2022/019447, filed on Dec. 2, 2022, which is based on and claims the benefit of a Russian Patent Application No. 2021135450, filed on Dec. 2, 2021, in the Russian Patent Office, the disclosures of which are incorporated by reference herein in its entirety.

BACKGROUND

Field

The disclosure relates to radio engineering and, for example, to the printed circuit board-integrated antenna of transmitting/receiving data.

Description of Related Art

The ever-increasing needs of users cause the rapid development of technologies in the field of communications and related fields. Currently, there is active development of systems using millimeter wave communications, such as data transmission systems 5G (28 GHz), WiGig (60 GHz), Beyond 5G (60 GHz), 6G (sub-THz). All these and similar systems require highly efficient, functional, yet simple and reliable components suitable for mass production.

One such component is a short distance transmit/receive antenna between different printed circuit boards (PCBs) or devices comprising such printed circuit boards. The main requirements for such an antenna are as follows: it must be integrated within a minimum number of PCB layers to provide a simple, low cost, compact, repeatable antenna design that is applicable for mass production; in addition, it must have low losses; finally, it must support stable transmission/reception of data at high speed (>2 Gbps), etc. However, the solutions existing in prior art, when trying to adapt them to the millimeter wave range, turn out to be unsuitable to satisfy the above requirements as much as possible, since they are either too expensive due to the use of expensive materials, or too bulky (requiring either the use of 5 to 16 layers of a multilayer printed circuit board, or the use of several printed circuit boards), or require insulation, or require precise mechanical assembly, or have poor resistance to thermal and mechanical stresses, or do not provide the specified data transfer rate, etc.

In particular, the known methods of data transmission over a short distance can be conditionally divided into two groups: a wired connection (traditional galvanic connection using metal conductors) and a wireless connection, which, in turn, can be subdivided into two subgroups: a connection based on radio communication and connection based on optical communication.

As an example of the galvanic connection, SMD (surface mount) connectors are known, which components are mounted or placed directly on the surface of a printed circuit board. As another example, RF (radio frequency) connectors are known which are mounted on the surface of a printed circuit board and allow the printed circuit boards to be interconnected. Such PCB connection methods require a galvanic isolation to provide a transition in the RF channel. These approaches have problems associated, for example, with low transmission frequency: SMD connectors operate with frequencies of up to 20 GHz and RF connectors operate with frequencies of up to 65 GHz. They are very sensitive to mechanical and thermal stresses, as well as to uneven assembly and soldering, which leads to low reliability of contacts, to changes in the parameters of the RF transition, to increased losses and, ultimately, to early failure of contacts. Therefore, it is necessary to spend a lot of time on assembly and mounting and maintain a minimum distance between the boards >8 mm.

As an example of radio-based wireless data transmission, NFC (Near Field Communication) data transmission is known. Existing NFC technologies have problems with shielding the magnetic field, which requires the use of a ferrite shield, which increases the occupied space. Such solutions have a narrow bandwidth and low data transfer rate (up to 2.1 Mbps), since the carrier frequency of this technology is 13.56 MHz.

With regard to wireless data transmission based on optical communication, existing optical technologies have inherent problems with the need for line-of-sight between the transmitter and receiver, as well as beam steering, which is mandatory because the size of the receiver is small compared to the overall dimensions of the device. Because of this, complex precise mechanics and tuning are required, which increases the space occupied, seriously changes the parameters of optical communication, and increases losses.

Attempted technical solutions in the field of printed circuit board—integrated antennas for transmitting/receiving data at high frequencies, more or less related to the disclosure, one can identify, for example, the document U.S. Pat. No. 9,153,863 B2 (06.10.2015), in which an integrated circuit package configuration is disclosed as the configuration including (a) an antenna system having extending antenna elements; (b) a substrate having the antenna system is attached to at least one cavity; and (c) at least one monolithic microwave integrated circuit (MMIC) mounted in the cavity, the extending antenna elements extend via the network of internal transmission pathways of the substrate and contact the MMIC establishing a transceiver circuit. The antenna system disclosed in this document is implemented through several, separate printed circuit boards. Thus, the problem of providing a simple, low cost, compact, repeatable antenna hardware design integrated within the minimum number of layers of a single multilayer printed circuit board, which is applicable for mass production, is not solved by the disclosed solution.

US2021/0091473 A1 (25.03.2021) discloses the design of more compact antenna module including a multi-layered structure in which a plurality of layers is stacked, wherein a slot is formed in one side of the multi-layered structure and a first power feeding part is positioned within the slot. To implement the antenna module and the power system according to the information disclosed in this document more than 4 layers are required. Therefore, the problem of providing a simple, low cost, compact, repeatable antenna hardware design integrated within the minimum number of layers of a single multilayer printed circuit board, which is applicable for mass production, is not solved by the disclosed solution as well.

Thus, there is a need for a printed circuit board-integrated antenna for transmitting/receiving data, which would completely or at least partially eliminate or reduce the following disadvantages with prior art solutions:

large sizes;
high manufacturing complexity;

the use of expensive and hard-to-reach materials;
high losses; and
low data transfer rate.

SUMMARY

Embodiments of the disclosure provide a printed circuit board-integrated antenna for transmitting/receiving data.

According to an example embodiment of the disclosure, in a printed circuit board-integrated antenna for transmitting/receiving data, the antenna is formed on adjacent layers of said printed circuit board, the adjacent layers are interconnected by a plurality of vias such that a conductive solid area is formed, wherein said adjacent layers of the printed circuit board comprise a lower layer, a lower middle layer, an upper middle layer, an upper layer, the antenna comprising: an intermediate section comprising patch elements interconnected by at least one via, wherein the first patch element is disposed in the lower middle layer and separated by a gap from the conductive solid area, the second patch element is disposed in the upper middle layer and separated by a gap from the conductive solid area; a parasitic patch element disposed in the upper layer and separated by a gap from the conductive solid area; and a strip line connected directly to an edge of the first patch element, the strip line being disposed in the lower middle layer and configured to communicate a data signal to or from the intermediate section when transmitting/receiving data.

Various example embodiments of the disclosure provide an antenna for transmitting/receiving data, which is integrated in a conventional printed circuit board and which is capable of operating in a millimeter wave range, and is more compact, and easy to manufacture.

BRIEF DESCRIPTION OF THE DRAWINGS

The above and other aspects, features and advantages of certain embodiments of the present disclosure will be more apparent from the following detailed description, taken in conjunction with the accompanying drawings, in which.

It should be understood that the figures may be represented schematically and not to scale and are intended mainly to improve understanding of the disclosure.

DETAILED DESCRIPTION

Figure 1:
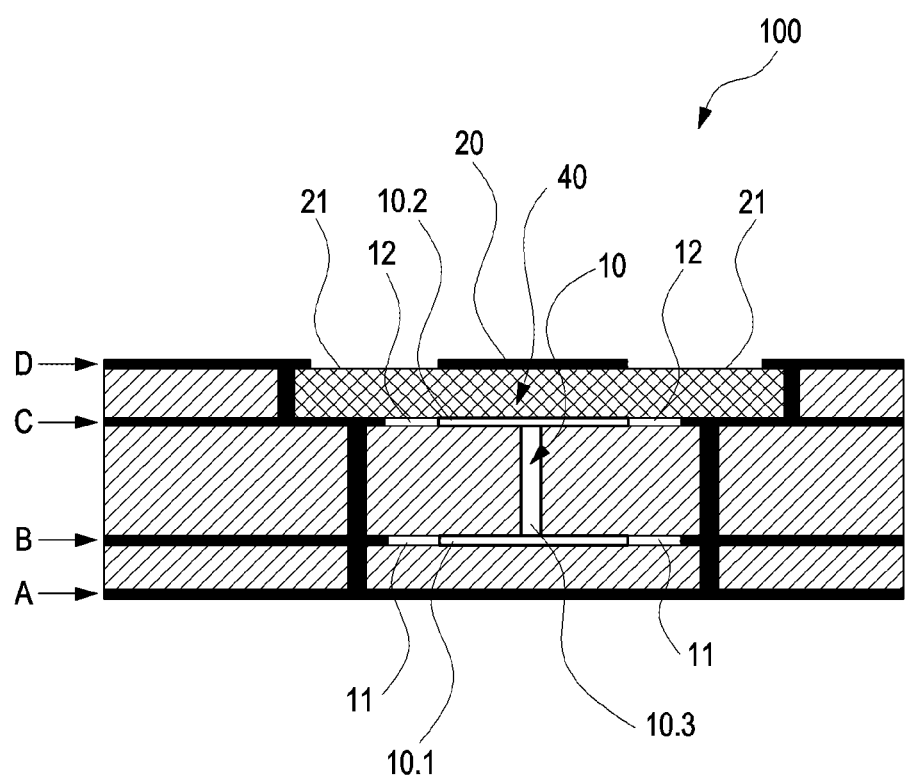
FIG. 1 is a cross-sectional view of a printed circuit board-integrated antenna for transmitting/receiving data according to various embodiments.
Figure 2A:
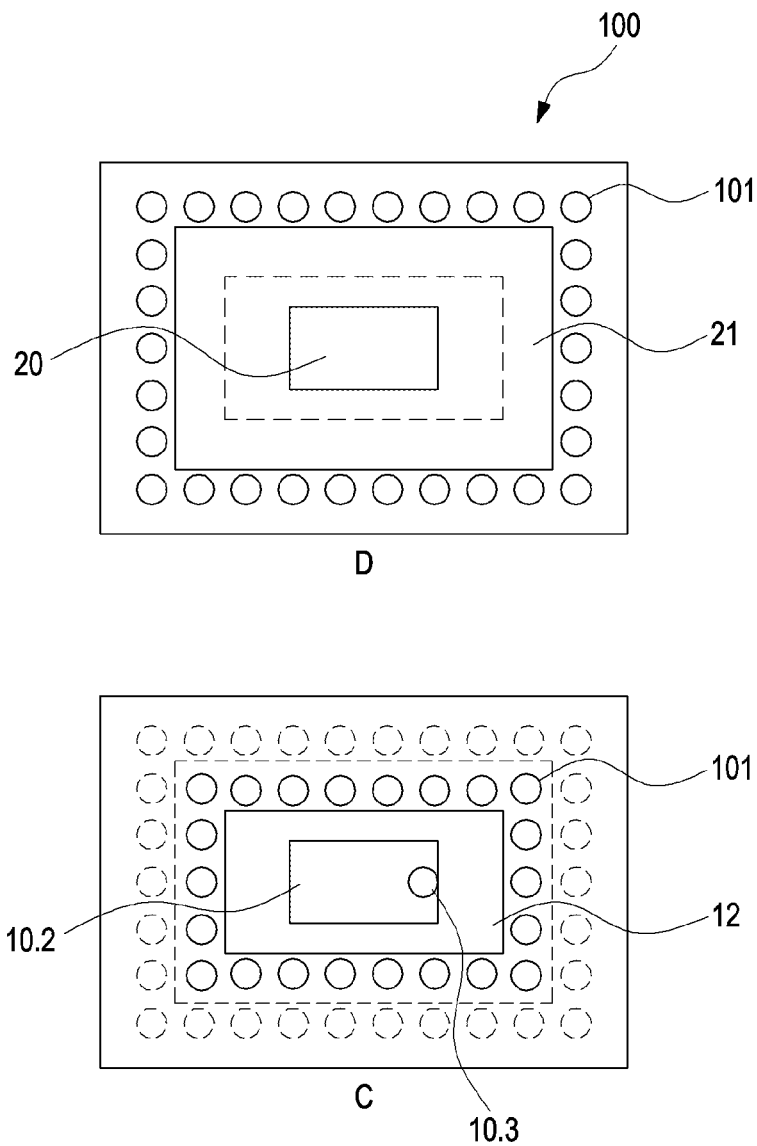
FIGS. 2A and 2B are top views of the printed circuit board-integrated antenna for transmitting/receiving data, which is illustrated in FIG. 1 according to various embodiments.
Figure 2B:
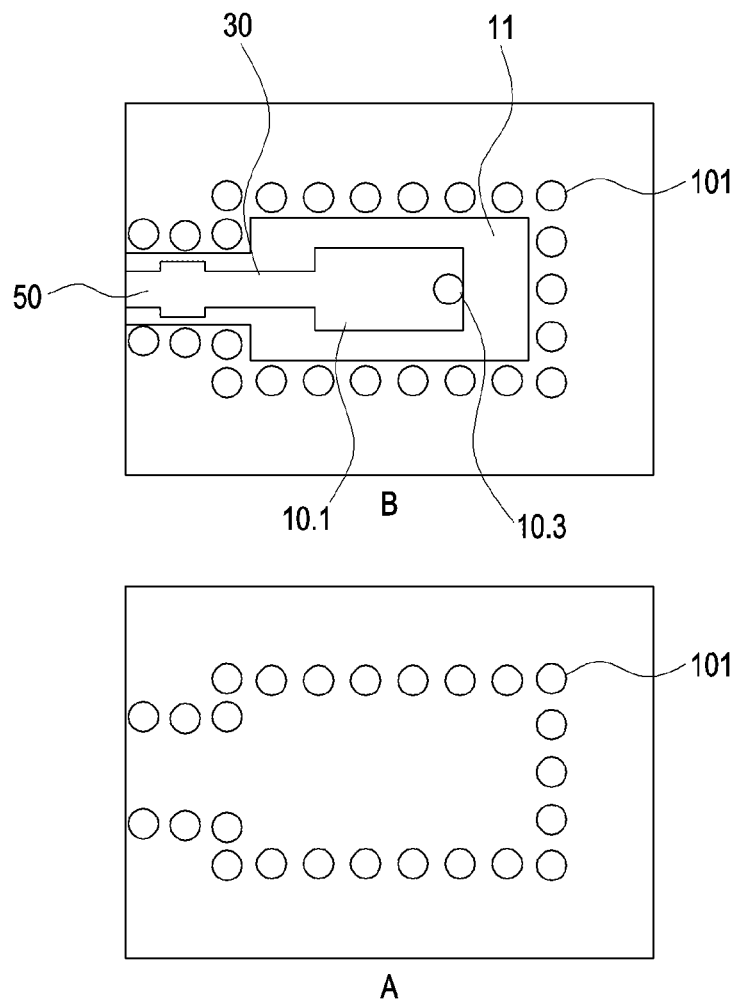

FIGS. 1, 2A and 2B are diagrams illustrating an example printed circuit board-integrated antenna 100 for transmitting/receiving data according to various embodiments. The antenna 100 for transmitting/receiving data is formed on adjacent layers of the printed circuit board. In an example embodiment, the antenna 100 is formed on no more than 4 conductive layers of the printed circuit board, which are interconnected by a plurality of vias 101 to form a conductive solid area. It should be understood that the total number of conductive layers of the printed circuit board is not limited and can be more than 4. The adjacent layers of the printed circuit board for forming the antenna 100 comprise an upper layer D, an upper middle layer C, a bottom middle layer B, and a lower layer A. The adjacent layers of the printed circuit board may be separated by three dielectric layers. Examples of readily available and inexpensive dielectric layer materials include, but are not limited to, conventional printed circuit board materials such as FR4, CEM3, VT462, FR408, M1222 (MI1222), СТФ (STF), etc.

Any other components not shown in the figures described below, for example a power element, a transceiver, and any other elements necessary for the printed circuit board to implement its functionality provided by its manufacturer, can be disposed on the printed circuit board. The following description is generally directed to implementation of the printed circuit board-integrated antenna 100 for transmitting/receiving data.

The antenna 100 shown in FIGS. 1, 2A and 2B, comprises an intermediate section 10 comprising patch elements (a patch element may be used interchangeably with the term patch antenna) 10.1, 10.2 interconnected by a via 10.3. While FIGS. 1, 2A and 2B show only one via 10.3, it should be understood that there can be more than one such via 10.3 (for example, from 2 to n, where n is any natural number; see, for example, FIGS. 3, 4, 8). A particular number of vias can be defined depending on a size and a shape of the patch elements 10.1, 10.2, and also depending on requirements for the shape of radiation pattern, gain, efficiency and matching of the antenna 100. A distance between the patch elements 10.1, 10.2 can be any, depending on the technological limitations of manufacturing and the known characteristics of the materials used. In this case, the distance between the patch elements 10.1, 10.2 is defined by the thickness of the dielectric layer between layers C and B. The distance range between the patch elements 10.1, 10.2 can be a multiple of the prepreg/core thicknesses of the currently used materials.

The first patch element 10.1 is disposed in the bottom middle layer B and separated by a gap 11 from the conductive solid area (illustrated as the thick solid lines in FIG. 1). The gap 11 may be obtained after etching the layer using known technological processes for the manufacturing of printed circuit boards. The gap 11 may be a dielectric gap that does not contain air, however, in some cases, air space may remain in this gap 11 due to imperfections in the process of manufacturing printed circuit boards (PCB). Normally no air remains in the gap 11. Width of the gap 11 affects the frequency matching of the whole antenna. In other words, the width of the gap 11 matches the impedance of the strip line 30 and the intermediate section 10. The minimum dimensions of gaps, including the gap 11, between conductive portions on the printed circuit board are determined by technological requirements. The layer B serves as a shield from other structures in the printed circuit board. Such shielded structures in the printed circuit board are outside the perimeter of the antenna 100 (e.g., not shown in the figures) and include, but are not limited to, various low frequency strip lines or any components integrated into the printed circuit board, such as resistors, capacitors, microcircuits, transceivers and other electronic components. Additionally, the multilayer printed circuit board may include multiple antennas 100 placed relatively close to each other, in this case, the layer B of each of the antennas 100 may serve as the shield.

Figure 8:
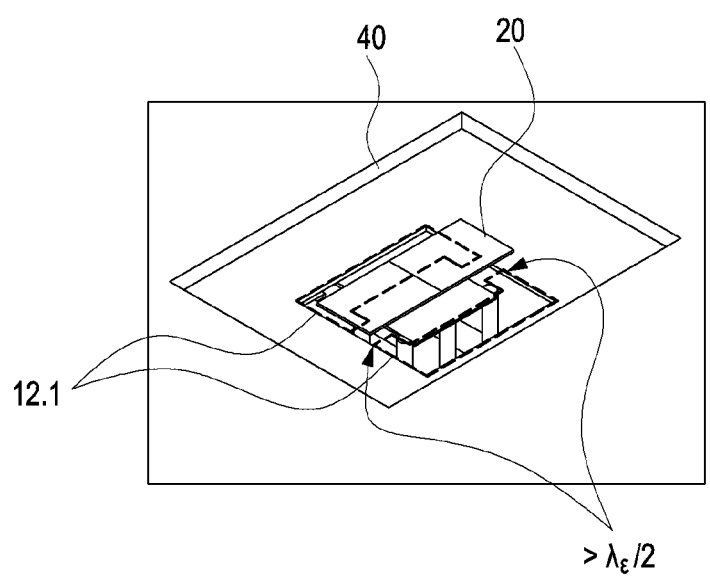
FIG. 8 is a perspective view of the configuration illustrated in FIG. 3, illustrating an example configuration of a cavity and a slot aperture according to various embodiments.

The second patch element 10.2 is disposed in the upper middle layer C and separated by a gap 12 from the conductive solid area. Similarly to the layer B the layer C serves as a shield from other structures in the printed circuit board. The gap 12 between the second patch element 10.2 and the conductive solid area may correspond to the gap 11, but the gap 12 in the layer C may further function as a slot aperture 12.1. An example of the slot aperture 12.1 is illustrated in FIG. 8. The slot aperture 12.1 is formed to encompass the second patch element 10.2. The slot aperture 12.1 may have a square, round, rectangular or oval shape. Shown with dotted lines in FIG. 8 are example shapes of portions of the slot aperture 12.1, the length of each portion of the slot aperture 12.1 is approximately $\lambda\varepsilon/2$ or more, where $\lambda\varepsilon$ is the wavelength in the dielectric calculated as follows: $\lambda_\varepsilon = \lambda_0 / \sqrt{\varepsilon_{\mathit{eff}}}$, where $\lambda 0$ is the wavelength in vacuum/air and $\varepsilon\mathit{eff}$ is the effective dielectric permittivity. The total perimeter length of the slot aperture 12.1 is about $\lambda\varepsilon$ or more. The perimeter length of the slot aperture 12.1 may, for example, be one whole $\lambda\varepsilon$, since two half-waves fit into this length, which contributes to the propagation of the electromagnetic field of namely TE11 mode, which in alternative terminology used in the art may be referred to as H11 mode.

The slot aperture 12.1 may be formed by two half-wave portions (see FIG. 8) which are curved around the patch element 10.2 and connected to each other at their ends so as to form a circumferential gap 12. In FIG. 8 the ends of portions of the slot aperture 12.1 are not shown connected to each other only for the purpose of easier visual identification of equal halves of the gap 12. The width of the gap 12 (including the slot aperture 12.1) is determined empirically to ensure the required matching in the frequency range. For example, narrowbandness/broadbandness of the antenna 100 can be achieved by adjusting the width of the gap 12. The overall dimensions and shape of the gap 12 define a position of the frequency range, e.g. shift this range up/down in frequency, as well as the operating frequency range (57-64 GHz is the operating range of the WiGig standard). The width of a portion of the gap 12, which is perpendicular to the electrical vectors, defines bandness of the antenna 100, and the length of said portion of the gap 12 defines resonant frequency of the antenna 100.

Antenna 100 may include a parasitic patch element 20 disposed in the upper layer D and separated by a gap 21 from the conductive solid area. The shape and dimensions of the gap are determined empirically according to the requirements for the antenna 100 in terms of the shape of radiation pattern, gain, efficiency and matching of the antenna 100. The gap 21 is formed by etching the printed circuit board. In the plane of the metal layer D, the gap 21 may be an air gap, and in the depth toward the layer C, the gap 21 comprises a dielectric layer (between the conductive layers D and C) of the printed circuit board. The overall dimensions and shape of the gap 21 define the shape of the radiation pattern, gain, efficiency, and matching of the antenna 100. The distance between the parasitic patch element 20 and the patch element 10.2 is defined by the thickness of the dielectric layer between layers D and C. The thickness of the dielectric layer may depend on materials of the printed circuit board, as well as on a laminator used in the manufacturing of the printed circuit board. The parasitic patch element 20 in various example embodiments may be a one-piece element (see FIGS. 1, 2A), but in an an embodiment, it may be a multi-piece element (see FIGS. 3, 8). Similarly to the layers B and C, the layer D may serve as a shield from other structures in the printed circuit board.

The antenna 100 includes a strip line 30 (see FIGS. 2B, 3, 4) connected directly to an edge of the first patch element 10.1 and disposed in the lower middle layer B. Such a galvanic connection of the strip line 30 precisely to the edge of the patch element 10.1 eliminates and/or reduces additional inhomogeneities in the radio frequency line (the line along which the microwaves propagate), which would require additional matching and matching elements. The strip line 30 feeds the intermediate section 10 and is intended to communicate a data signal (e.g., a radio frequency signal representing the data) to or from the intermediate section 10 of the antenna 100 when, respectively, transmitting and/or receiving data. The strip line 30 may be any available microwave transmission line (including, but not limited to, a microstrip) over which TEM wave propagates.

Because the operational strip line 30 differs from the theoretical one in additional dielectric loading, it may be required to adjust the design of the line empirically to the necessary requirements. For this adjustment, suitable values of the following parameters of the strip line 30 can be determined empirically: line width (the signal line), line thickness, and distance from the line to the ground (layer A). The impedance of the strip line 30 depends from the line width and the distance from the line to the ground. TEM (Transverse Electro-Magnetic) mode propagates in the strip line 30, and H11/TE11-like mode propagates in the intermediate section 10 between the patch elements 10.1, 10.2 (see FIG. 4). TE mode/wave is a guided-wave mode that depends on transverse electrical waves, also sometimes referred to as H-waves, and is characterized in that the electrical vector (E) is always perpendicular to the direction of propagation. TEM mode/wave is a transverse electromagnetic wave characterized in that both the electric vector (vector E) and the magnetic vector (vector H) are perpendicular to the direction of propagation. The layer A serves as the ground and the shield for the strip line 30.

Printed circuit board-integrated antenna 100 for transmitting/receiving data comprises a cavity 40 formed between the upper layer D and the upper middle layer C and has a side boundary formed substantially between a dielectric with which the cavity 40 is filled and at least those vias from said plurality of vias 101, which interconnect the upper layer D and the upper middle layer C (see FIG. 2A). The cavity 40 is schematically shown with double hatching in FIG. 1, the cavity 40 is shown isometrically in FIG. 8. It should be clear that the two different types of hatchings in FIG. 1 are for one (the same) material - a dielectric, and double hatching is used in FIG. 1 is used to identify of the approximate boundaries of the cavity 40. Thus, it can be said that the side boundary of the cavity 40 is formed by the dielectric-vias interface and further includes dielectric regions between adjacent vias. The cavity 40 may serve as a resonator of the antenna 100, and its dimensions are selected in such a way that a narrow radiation pattern of the antenna 100 is formed with the required gain and efficiency. The cavity 40 may be configured to form a narrow radiation pattern. The thickness of the cavity 40, the longitudinal length of the cavity 40 (which is parallel to the electrical vector of the wave in the gap 12 of the layer C), and the transverse length of the cavity are determined empirically to provide the desired parameters of the antenna 100 in terms of the shape of radiation pattern, gain, efficiency, and matching. The length of the cavity 40 was selected to correspond to the half of the operating wavelength ($\lambda 0/2$) in free space. The height/depth of the cavity 40 corresponds to the distance from the patch element 10.2 to the parasitic patch element 20 and is determined according to materials used in the manufacturing of the printed circuit board.

Referring to FIG. 2B, the printed circuit board-integrated antenna 100 for transmitting/receiving data the strip line 30 further comprises a matching element 50 (e.g. a strip transformer) configured to transform impedances of the strip line 30 and the first patch element 10.1 to reduce losses. An approximate value of the impedance of the strip line 30 may be within a range of, for example, from 40 to 60 ohms. In various embodiments the strip line may have an impedance of 50 ohms, or, depending on technology limitations, may be closer to about 50 ohms. This impedance value is chosen as an optimum value between the throughput and attenuation in the strip line 30. The matching element 50 has two parameters: width and length. These parameters are chosen to compensate for the reactive part of the impedance that occurs at the junction of the strip line 30 and the intermediate section 10. Changing these parameters of the matching element 50 affects the matching of the strip line 30 with the intermediate section 10 of the antenna 100 and, consequently, the efficiency and radiation gain of the antenna 100. In addition, changing these parameters of the matching element 50 affects the width of the operating frequency range.

Figure 3:
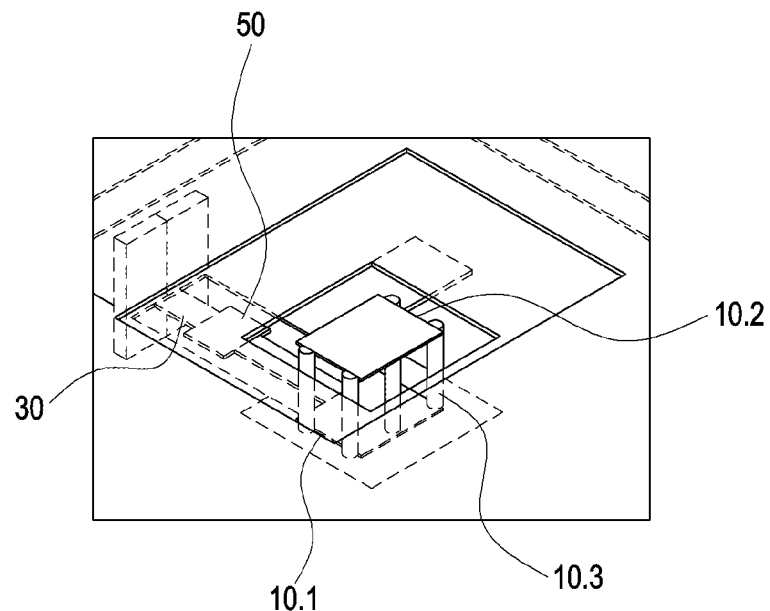
FIG. 3 is a partial perspective view of an example configuration of a printed circuit board-integrated antenna for transmitting/receiving data according to various embodiments.
Figure 4:
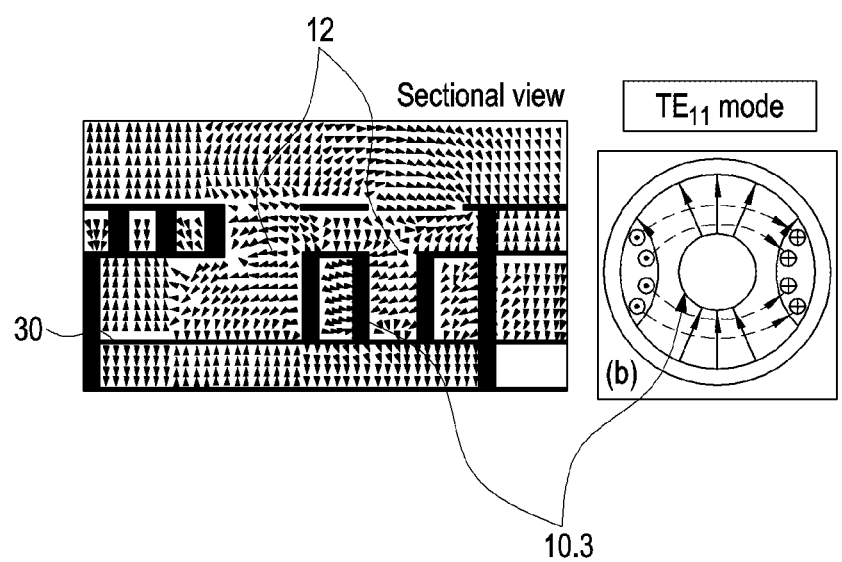
FIG. 4 is a diagram illustrating an example representation of an electromagnetic vector field generated by the antenna for transmitting/receiving data having the configuration illustrated in FIG. 3 according to various embodiments.

When transmitting data, the intermediate section 10 of the antenna 100 may generate an electromagnetic field equivalent to the coaxial waveguide highest mode propagating from the feeding strip line 30 to the slot aperture 12.1 reradiating the electromagnetic field towards the parasitic patch element 20 for its excitation, which, in response to such excitation, reradiates the electromagnetic field into free space. The TEM mode is propagated in the strip line 30, and H11/TE11-like mode is propagated in the intermediate section 10 between the patch elements 10.1, 10.2 (see FIG. 4). This makes it possible to achieve the radiation pattern having strong directional properties (up to the directivity value of approximately 6 dB for the antenna above the ground). When receiving data, the parasitic patch element 20 is configured to receive the electromagnetic field from free space, reradiate the electromagnetic field to the slot aperture and the intermediate section 10. The schematic representation of the electromagnetic vector field generated by the antenna 100 for transmitting/receiving data having the configuration isometrically illustrated in FIG. 3 is illustrated in FIG. 4. The configuration of the antenna 100 for transmitting/receiving data in FIGS. 3, 4 is the other possible configuration that differs from the configuration of the antenna 100 for transmitting/receiving data, which is illustrated in FIGS. 1, 2A and 2B, in the number of vias 10.3 (one such via is shown in FIGS. 1, 2A and 2B, using six such vias is shown in FIGS. 3, 4).

The parasitic patch element 20 may have a shape and size that is the same as or different from the shape and size of the patch elements 10.1, 10.2. In an embodiment, the patch elements 10.1, 10.2 and the parasitic patch element 20 may have the same square, round, rectangular, or oval shape. In an embodiment the patch elements 10.1, 10.2 have any shape of square, round, rectangular, or oval shapes, and the parasitic patch element 20 has the other shape of square, round, rectangular, or oval shapes. The patch elements 10.1, 10.2 and the parasitic patch element 20 may be designed to have a perimeter equal to 1 wavelength in the dielectric.

In an embodiment, the parasitic patch element 20 and the patch elements 10.1, 10.2 may be disposed such that the center of the parasitic patch element 20 and the center of the patch elements 10.1, 10.2 are aligned with each other. In other words, in this example, the parasitic patch element 20 is centered relative to the patch elements 10.1, 10.2. In an embodiment, the parasitic patch element 20 and the patch elements 10.1, 10.2 may be disposed so that the center of the parasitic patch element 20 is offset from the center of the patch elements 10.1, 10.2. The above-described configuration of antenna 100 allows the antenna 100 to operate in the millimeter wave range with improved performance compared to prior art antennas with more complex configurations as confirmed by mathematical simulations using the design system that allows simulating various configurations of the antenna 100 and computing its characteristics. The results of the mathematical simulations carried out are reported below with reference to FIGS. 5A, 5B, 5C, 6A, 6B, 6C, 7A, 7B and 7C.

Figure 5A:
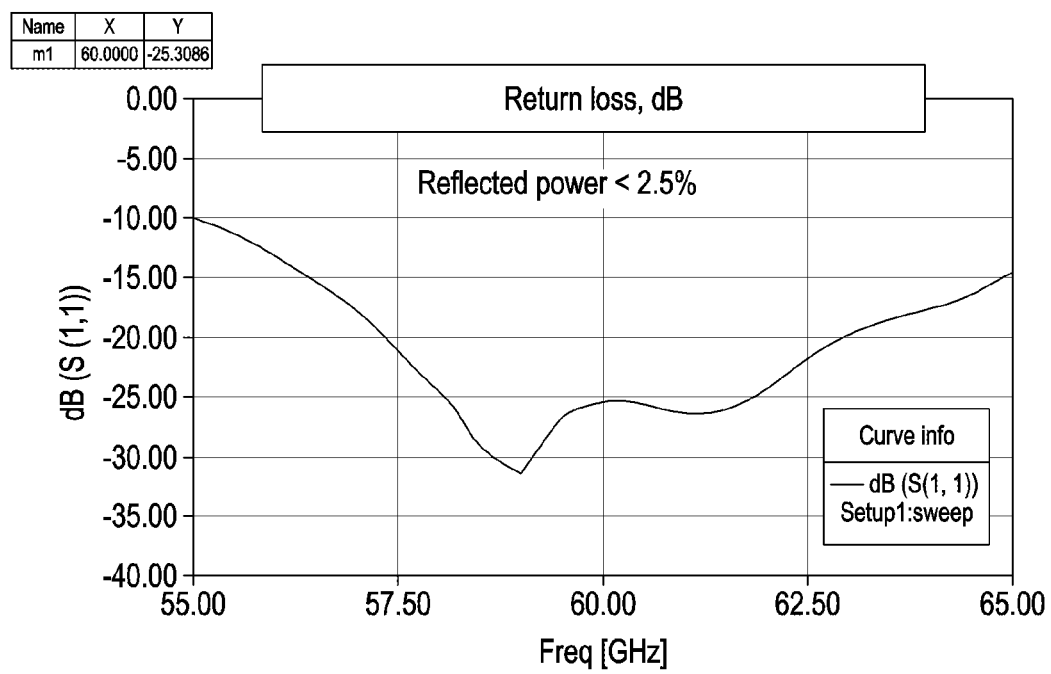
FIGS. 5A, 5B and 5C are graphs illustrating example results of mathematical simulation of the characteristics of the antenna for transmitting/receiving data having the configuration illustrated in FIG. 3 according to various embodiments.
Figure 5B:
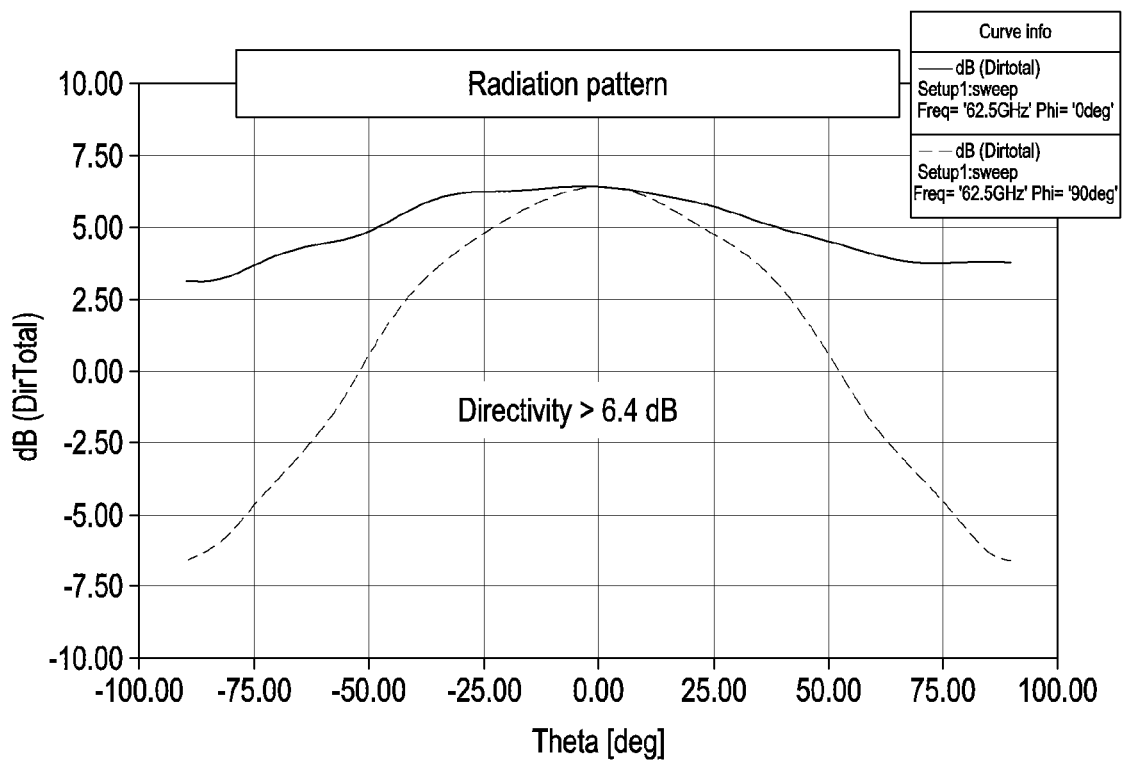
Figure 5C:
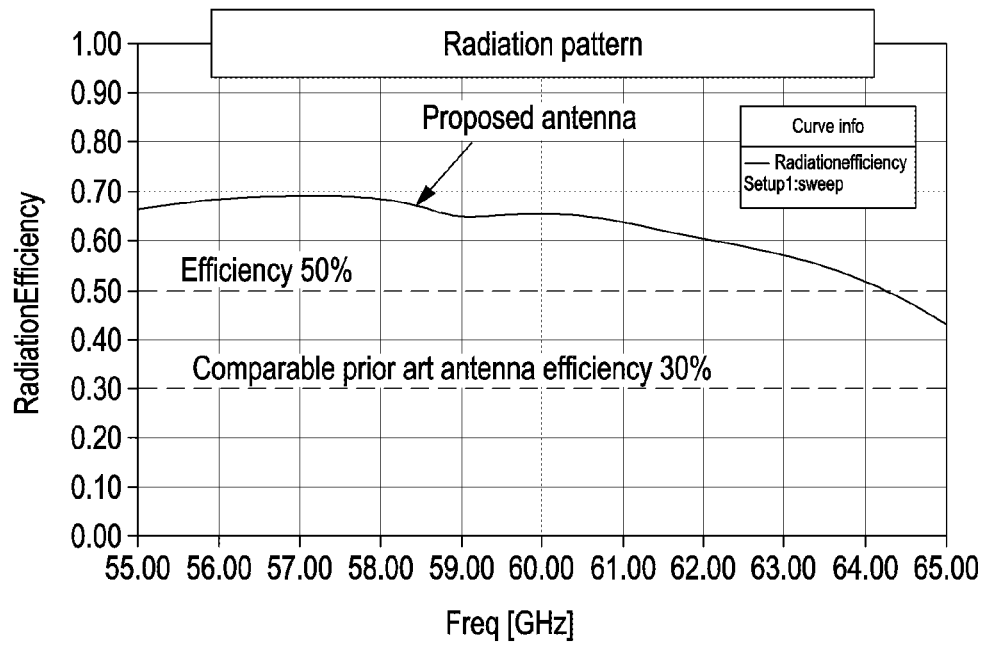

FIGS. 5A, 5B and 5C are graphs illustrating example results of mathematical simulation 1 of the characteristics of the antenna for transmitting/receiving data, which is illustrated in FIG. 3 according to various embodiments. The antenna for which the results are shown in FIGS. 5A, 5B and 5C have the configuration shown in FIGS. 3 and 4 and was matched to operate in the WiGig standard (60 GHz). As shown in FIG. 5A, the power loss was less than 2.5%. As shown in FIG. 5B, the directivity of such an antenna was more than 6 dB. As shown in FIG. 5C, the radiation efficiency of such an antenna was more than 50%, which is a fairly good result for the category of antennas built into printed circuit boards. Therefore, the disclosed antenna configuration had a high radiation efficiency and a low reflected power level, despite being made on a commercial grade substrate with high dielectric losses and large thickness.

Figure 6A:
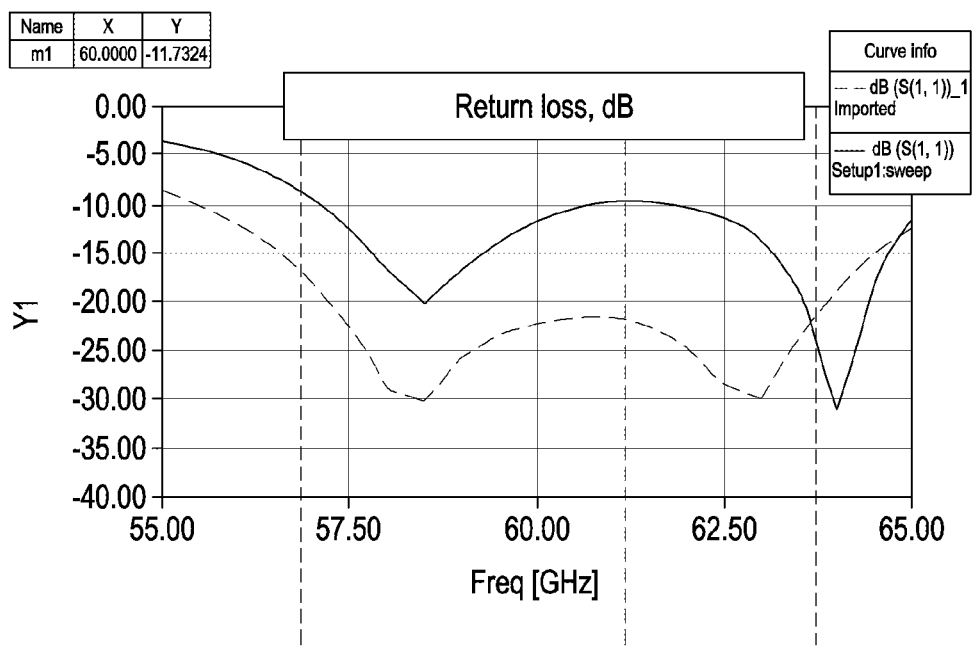
FIGS. 6A, 6B and 6C are graphs illustrating example results of mathematical simulation of the characteristics of the antenna for transmitting/receiving data having a configuration with round patch elements and a round parasitic patch element according to various embodiments.
Figure 6B:
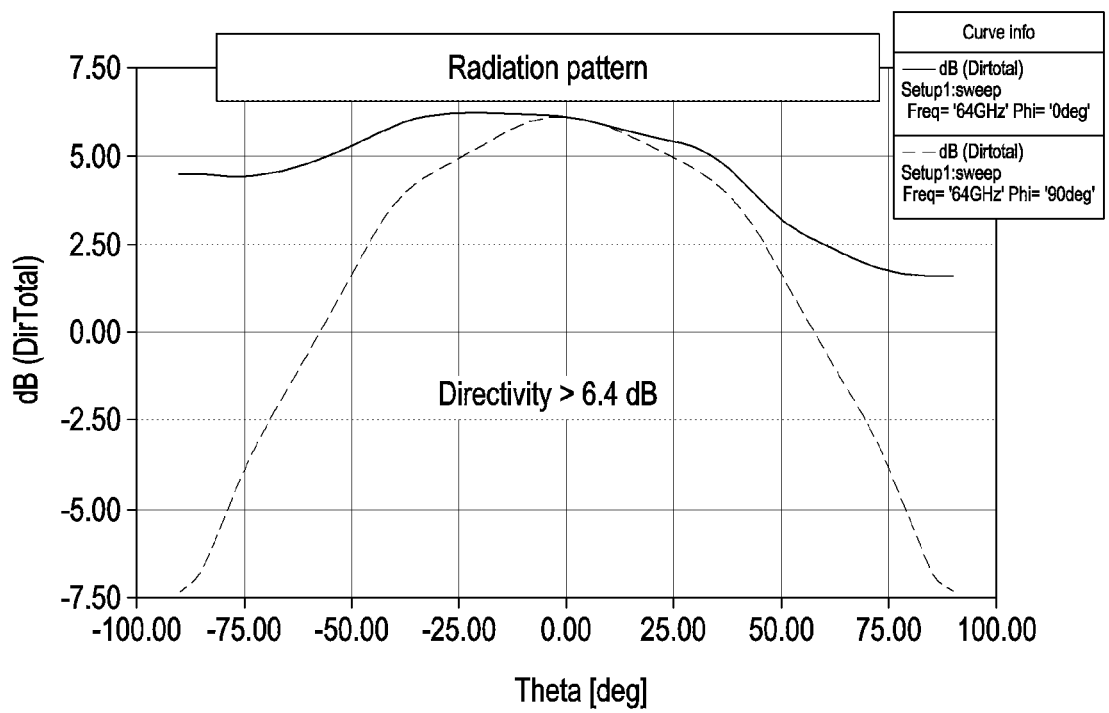
Figure 6C:
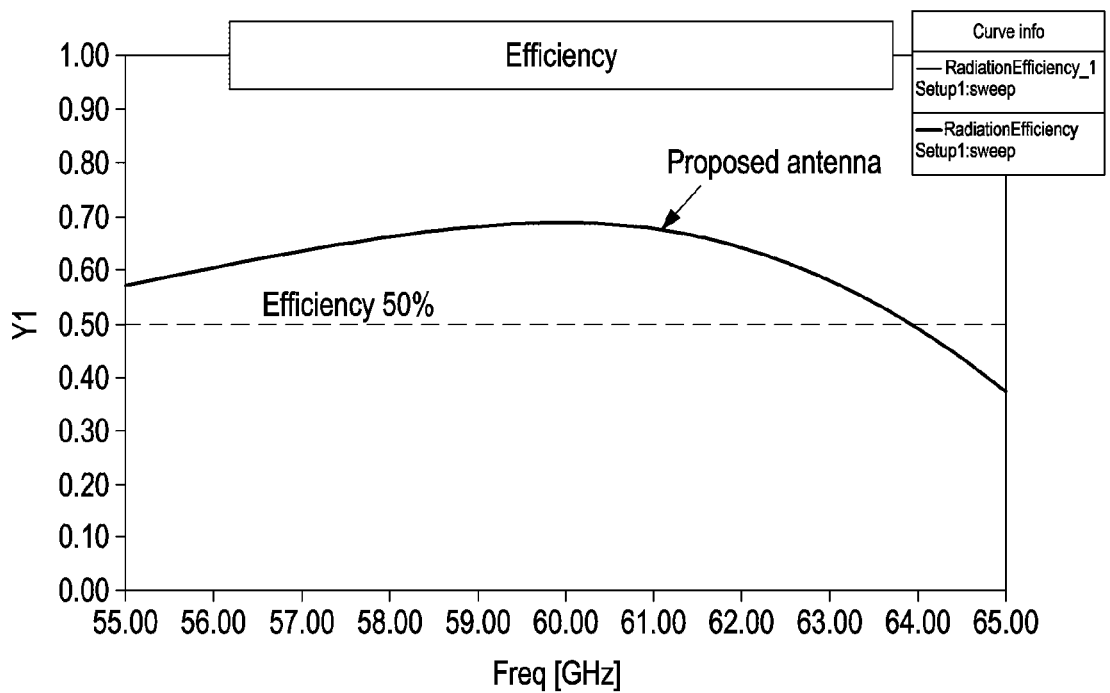

FIGS. 6A, 6B and 6C are graphs illustrating example results of mathematical simulation 2 of the characteristics of the antenna for transmitting/receiving data having the configuration with round patch elements and the round parasitic patch element according to various embodiments. The antenna configuration computed in this simulation 2 differed from the antenna configuration in the mathematical simulation 1 in that the parasitic patch element 20 and the patch elements 10.1, 10.2 did not have a square shape, but a shape that was like a circle. Additionally, in the antenna configuration computed in this simulation 2, eight vias 10.3 connected the patch elements 10.1, 10.2 to each other, these eight vias 10.3 were disposed at the edges of the circumferences of the patch elements 10.1, 10.2. The aperture diameter at the plane of the gap 21 was approximately equal to $\lambda 0/2$. The distance from the layer B to the layer C was about 0.16 $\lambda 0$, and the distance from the layer A to the layer D was about λ0/3. The described antenna configuration (not shown in the figures) was even more compact and required fewer parameters subject to optimization.

The antenna for which the results are shown in FIGS. 6A, 6B and 6C having the above-described configuration and was matched to operate in the WiGig standard (60 GHz). As shown in FIG. 6A, the return loss was less than 10 dB. As shown in FIG. 6B, the directivity of such an antenna was more than 6 dB. As shown in FIG. 6C, the radiation efficiency of such an antenna was more than 50%, which is the fairly good result for the category of antennas integrated into printed circuit boards. The disclosed antenna configuration had a high radiation efficiency and a low reflected power level, despite being made on the commercial grade substrate with high dielectric losses and large thickness.

Figure 7A:
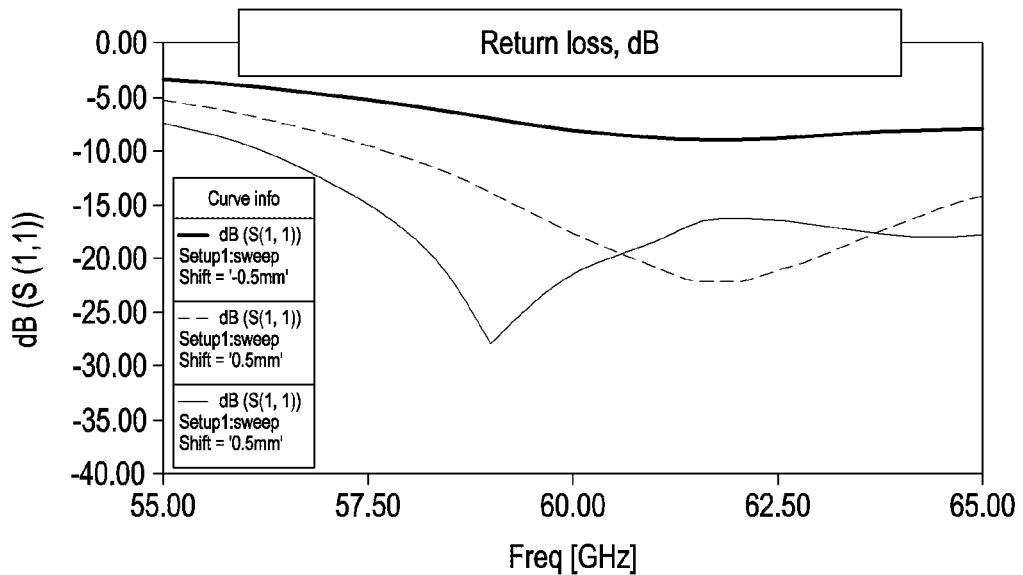
FIGS. 7A, 7B and 7C are graphs illustrates example results of mathematical simulation of the characteristics of the antenna for transmitting/receiving data, in which a parasitic patch element is disposed with different offsets relative to patch elements of the intermediate section according to various embodiments.
Figure 7B:
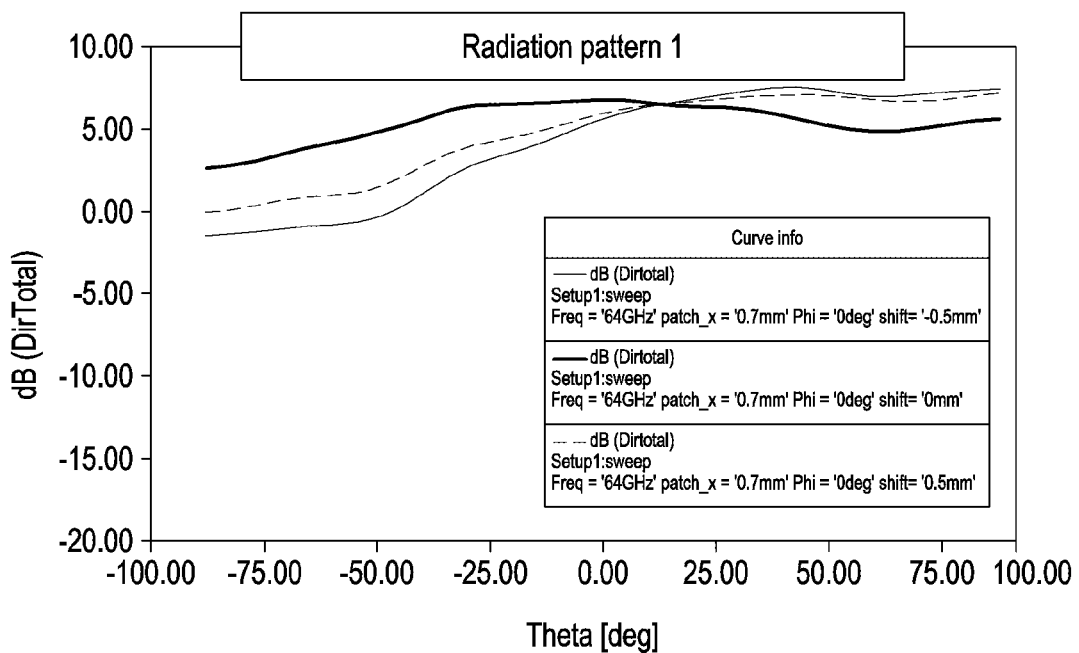
Figure 7C:
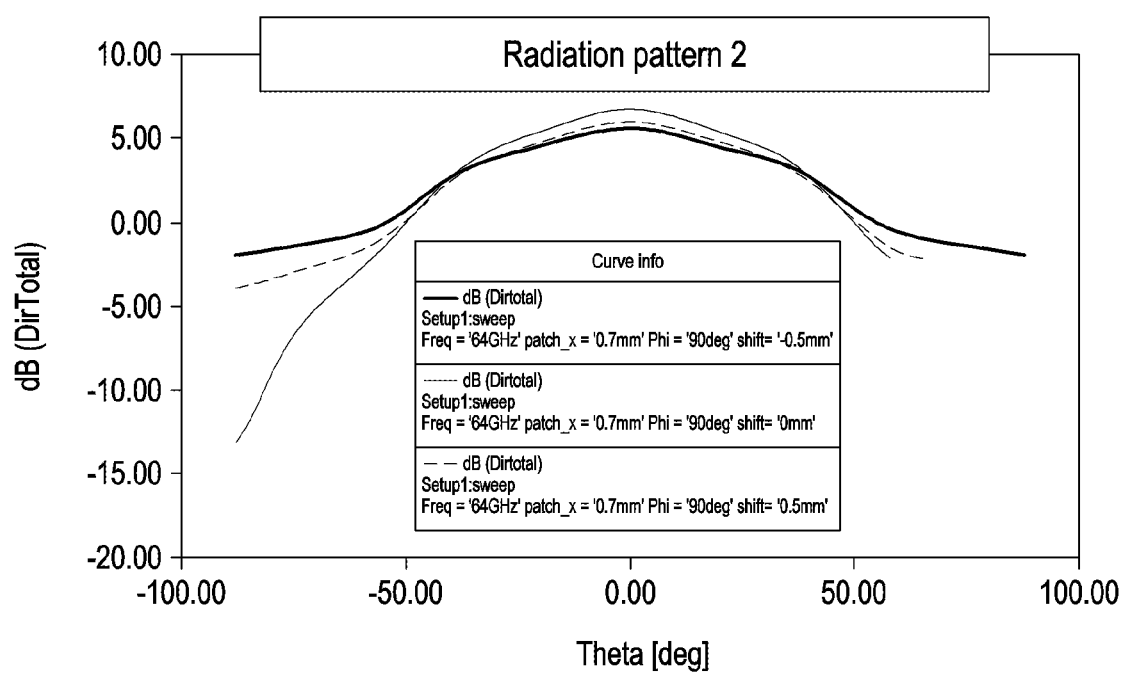

FIGS. 7A, 7B and 7C are graphs illustrating example results of mathematical simulation 3 for the characteristics of the antenna for transmitting/receiving data, in which the parasitic patch element 20 was disposed with different offsets relative to the patch elements 10.1, 10.2 of the intermediate section 10 according to various embodiments. The displacement of the parasitic patch element 20 relative to the patch elements 10.1, 10.2 was performed in the cavity 40 essentially along the direction of the longitudinal axis of the strip line 30. In all other respects the antenna configuration computed in this simulation 3 essentially corresponded to the antenna configuration shown in FIGS. 3 and 4. This simulation 3 shows that the offset of the parasitic patch element 20 allowed to perform radiation (directivity) pattern adjustment and antenna matching. The shape of the radiation pattern made it possible to avoid reception from unwanted directions and reduce unnecessary noise, and changing the radiation pattern did not affect the antenna gain.

The antenna for which the results are shown in FIGS. 7A, 7B and 7C had the above described configuration and was matched to operate in the WiGig standard (60 GHz). As shown in FIG. 7A, the return loss was less than 10 dB. The three lines shown in FIG. 7B show the directivity of the simulated antenna for the following placements of the parasitic patch element 20 relative to the patch elements 10.1, 10.2: +0.05 mm, 0 mm (no offset), −0.05 mm. The three lines shown in FIG. 7B show the directivity of the simulated antenna for the following placements of the parasitic patch element 20 relative to the patch elements 10.1, 10.2: +0.05 mm, 0 mm (no offset), −0.05 mm with the value of φ equal to 0°. The values in FIGS. 7B and 7C show radiation pattern slices of the simulated antennas that are plotted in the spherical coordinate system, where φ and θ are the angular coordinates of the spherical coordinate system. The z axis is normal to the plane of the printed circuit board, φ is measured from one of the axes parallel to the sides of the patch element. The three lines shown in FIG. 7C show the directivity of the simulated antenna for the following placements of the parasitic patch element 20 relative to the patch elements 10.1, 10.2: +0.05 mm, 0 mm (no offset), −0.05 mm with the value of φ equal to 90°. Efficiency graph is not shown, but the radiation efficiency of such an antenna was more than 50%, which is the fairly good result in the category of antennas integrated into printed circuit boards. Therefore, the disclosed antenna configuration had a high radiation efficiency and a low reflected power level, despite being made on the commercial grade substrate with high dielectric losses and large thickness.

Any of the disclosed embodiments of the printed circuit board-integrated antenna 100 for transmitting/receiving data according to the present disclosure can be produced in the manufacturing process that will have relatively low complexity due to the simplified configuration of the disclosed antenna 100. Therefore, this application also provides a method of manufacturing the disclosed antenna 100 in any of the disclosed configurations. The steps of such a method are conventional assembly steps that are known to those skilled in the art and are not described in detail here. The purpose of each or all of these steps is to form all the required elements of the antenna 100 with the appropriate vias/contacts on the appropriate layers of the printed circuit board and then combine the resulting layers.

Any of the disclosed embodiments of the printed circuit board-integrated antenna 100 for transmitting/receiving data according to the present disclosure provides many advantages over the prior art. For example, assembly and manufacturing are simplified, and the wireless channel with improved power efficiency, reduced radio frequency power leakage, and improved resistance to electromagnetic interference (EMI) can be provided with the antenna 100. The data rate increased to 2.5 Gbps (experimental tests show that it is possible to transfer data at a rate of 6 Gbps without significant jitter). The structure of the antenna 100 is more resistant to mechanical deformations. External shielding is not required. The minimum/reduced number of layers of the printed circuit board is used. Improved reliability and reduced requirements for production tolerances are provided by simplifying the configuration. The disclosed antenna 100 is compact and low loss and can be successfully used for mmWave and sub-THz applications.

It should be understood that this application discloses the principles of construction and basic examples of the antenna 100 integrated into the minimum number of conductive layers of the printed circuit board. A person skilled in the art, using these principles, will be able to obtain various modified embodiments of the disclosure without undue experimentation and without making creative efforts.

The antenna 100 according to the disclosure can be used in electronic devices that require the transmission of radio frequency signals over a short distance, for example, in the millimeter wave range for mobile communications networks 5G (28 GHz), WiGig (60 GHz), Beyond 5G (60 GHz), 6G (sub-THz), for automotive radar systems (24 GHz, 79 GHz), for short distance communication (60 GHz), for smart home systems and other mmWave-band adaptive intelligent systems, for car navigation, for Internet of Things (IoT), wireless charging, etc.

Specific applications of the antenna 100 include, but are not limited to, (1) gigabit communications (THz band graphene antennas for wireless communications within the same circuit or between different circuits (chips) with a 360° field of view without mechanical rotation), (2) short distance communication for high data rate interfaces (kiosks, wireless connectors, mobile terminals). Additionally, the antenna 100 can be used for communication between IoT system components and a smartphone. Other application of the antenna 100 include radar sensors and modular micro LED TVs, in the latter case the antenna 100 can be used to perform the communication between different modules of such a composite TV.

It should be understood that although terms such as "first", "second", "third" and the like may be used herein when various elements, components, regions, layers and/or sections are described, these elements, components, regions, layers and/or sections should not be limited by these terms. These terms are simply used to distinguish one element, component, region, layer, or section from another element, component, region, layer, or section. Thus, a first element, component, region, layer, or section may be referred to as a second element, component, region, layer, or section without departing from the scope of the present disclosure. As used herein, the term "and/or" includes any and all combinations of one or more of the respective listed positions. The mention of elements in the singular does not exclude a plurality of such elements, unless explicitly stated otherwise.

The functionality of an element identified in the disclosure or the claims as a single element may be made of multiple components of the antenna, and vice versa, the functionality of elements identified in the disclosure or the claims as several separate elements may be made as a single component.

In an embodiment, elements/parts of the disclosed antenna are connected to each other and to other elements/parts of the printed circuit board structurally through mounting (assembly) operations and functionally through the communication lines. Said communication lines or channels, unless otherwise indicated, are standard communication lines known to skilled persons, the material implementation of which does not require creative efforts. The communication link may be a wire, a set of wires, a bus, a track, a wireless link (inductive, RF, infrared, ultrasonic, etc.). Communication protocols over communication lines are known to those skilled in the art and are not disclosed separately.

The functional connection of elements should be understood as a connection that ensures the correct interaction of these elements with each other and the implementation of one or another functionality of the elements. Various examples of functional communication may be communication with the ability to exchange information, communication with the ability to transmit electric current, communication with the ability to transmit mechanical motion, communication with the ability to transmit light, sound, electromagnetic or mechanical vibrations, etc. The specific type of functional connection is determined by the nature of the interaction of the mentioned elements, and, unless otherwise indicated, is provided by well-known means, using principles well-known in the art.

The structural design of the elements of the disclosed antenna is known to those skilled in the art and is not described separately in this disclosure, unless otherwise indicated. The antenna elements may be made from any suitable and readily available material. These components can be produced using known methods including, by way of example only, machining, investment casting, crystal growth. Assembly, connection, and other operations as described herein are also within the knowledge of a person skilled in the art, and thus will not be explained in more detail here.

Although various example embodiments have been described and shown in the accompanying drawings, it should be understood that such embodiments are illustrative only and are not intended to limit the present disclosure, and that the present disclosure should not be limited to the particular arrangements and structures shown and described, since various other modifications and embodiments of the disclosure may be apparent to a person skilled in the art based on the information set forth in the description and knowledge of the prior art, without going beyond the spirit and scope of this disclosure. It will also be understood that any of the embodiment(s) described herein may be used in conjunction with any other embodiment(s) described herein.

What is claimed is:

1. Printed circuit board-integrated antenna configured to transmit/receive data, the antenna being formed on adjacent layers of said printed circuit board, the adjacent layers being interconnected by a plurality of vias to form a conductive solid area, wherein said adjacent layers of the printed circuit board comprise a lower layer, a lower middle layer, an upper middle layer, and an upper layer, the antenna comprising:
    an intermediate section comprising first and second patch elements interconnected by at least one via, wherein the first patch element is disposed in the lower middle layer and separated by a gap from the conductive solid area, the second patch element is disposed in the upper middle layer and separated by a gap from the conductive solid area;
    a parasitic patch element disposed in the upper layer and separated by a gap from the conductive solid area; and
    a strip line connected directly to an edge of the first patch element, the strip line being disposed in the lower middle layer configured to communicate a data signal to or from the intermediate section when transmitting/receiving data.

2. The printed circuit board-integrated antenna of claim 1, wherein a cavity is disposed between the upper layer and the upper middle layer, the cavity having a side boundary formed substantially between a dielectric with which the cavity is filled and at least vias from said plurality of vias interconnecting the upper layer and the upper middle layer, wherein said cavity is configured as a resonator of the antenna.

3. The printed circuit board-integrated antenna of claim 1, wherein the strip line further comprises a matching element configured to transform impedances of the strip line and the first patch element.

4. The printed circuit board-integrated antenna of claim 1, wherein said plurality of vias forming the conductive solid area in said adjacent layers of the printed circuit board are in a shape of a horn.

5. The printed circuit board-integrated antenna of claim 1, wherein said gap between the second patch element and the conductive solid area is a shape of a slot aperture.

6. The printed circuit board-integrated antenna of claim 5, wherein the slot aperture surrounds the second patch element and has a square, round, rectangular or oval shape.

7. The printed circuit board-integrated antenna of claim 5, wherein, when transmitting data, the intermediate section is configured to generate an electromagnetic field propagating from the strip line to the slot aperture reradiating the electromagnetic field towards the parasitic patch element to excite the parasitic patch element, which is configured to, in response to excitation, reradiate the electromagnetic field into free space, wherein transverse electro-magnetic mode (TEM) is configured to propagate in the strip line, and H11/TE11-like mode is configured to propagate in the intermediate section between the patch elements.

8. The printed circuit board-integrated antenna of claim 7, wherein, when receiving data, the parasitic patch element is configured to receive the electromagnetic field from free space, reradiate the electromagnetic field to the slot aperture and the intermediate section.

9. The printed circuit board-integrated antenna of claim 1, wherein said adjacent layers of the printed circuit board are separated by at least three dielectric layers.

10. The printed circuit board-integrated antenna of claim 2, wherein said gap between the second patch element and the conductive solid area is a shape of a slot aperture, and the slot aperture is configured to have a perimeter equal to a wavelength in a dielectric $\lambda_\epsilon = \lambda_0/\sqrt{\epsilon_{eff}}$, where $\lambda 0$ is a wavelength in vacuum/air and $\epsilon$eff is an effective dielectric permittivity of the dielectric.

11. The printed circuit board-integrated antenna of claim 1, wherein the parasitic patch element has a same or different shape and size as the patch elements.

12. The printed circuit board-integrated antenna of claim 1, wherein the patch elements and the parasitic patch element have a square, round, rectangular or oval shape.

13. The printed circuit board-integrated antenna of claim 1, wherein the patch elements have any shape of square, round, rectangular, or oval shapes, and the parasitic patch element has another shape of square, round, rectangular, or oval shapes.

14. The printed circuit board-integrated antenna of claim 1, wherein the patch elements and the parasitic patch element are configured to have a perimeter equal to 1 wavelength in the dielectric.

15. The printed circuit board-integrated antenna of claim 1, wherein the parasitic patch element and the patch elements are disposed so the center of the parasitic patch element and the center of the patch elements are aligned.

16. The printed circuit board-integrated antenna of claim 1, wherein the parasitic patch element and the patch elements are disposed so the center of the parasitic patch element is offset relative to the center of the patch elements.

17. The printed circuit board-integrated antenna of claim 1, wherein the antenna is configured to operate in the millimeter wave range.

* * * * *